(12) United States Patent
Kapogiannis et al.

(10) Patent No.: US 6,214,523 B1
(45) Date of Patent: Apr. 10, 2001

(54) PATTERN FORMATION BY REMOVAL OF PASTE MATERIAL

(75) Inventors: Chris T. Kapogiannis; John R. Lankard, Jr., both of Poughkeepsie; Gerald H. Leino, Walden; Thomas J. VanDuynhoven, Monroe, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/005,137

(22) Filed: Jan. 9, 1998

(51) Int. Cl.[7] ............................... G03C 5/00; B28B 1/00; C04B 33/32; B05D 3/00
(52) U.S. Cl. ..................... 430/311; 430/330; 264/646; 264/603; 277/943; 427/554; 427/555
(58) Field of Search ...................... 264/646, 603; 277/943; 430/311, 330; 427/554, 555

(56) References Cited

U.S. PATENT DOCUMENTS

| | | | |
|---|---|---|---|
| 4,345,955 | * 8/1982 | Bakemans et al. | 156/89 |
| 4,578,329 | 3/1986 | Holsappel | 430/18 |
| 4,931,323 | 6/1990 | Manitt et al. | 427/53.1 |
| 5,262,614 | 11/1993 | Katayama et al. | 219/121.69 |
| 5,294,754 | * 3/1994 | Wu | 174/255 |
| 5,403,650 | * 4/1995 | Baudrand et al. | 428/209 |
| 5,552,574 | 9/1996 | Merlin et al. | 219/121.69 |
| 5,580,473 | 12/1996 | Shinohara et al. | 219/121.69 |

OTHER PUBLICATIONS

IBM Technical Disclosure Bulletin, vol. 29, No. Dec. 7, 1986.

* cited by examiner

Primary Examiner—Steven P. Griffin
Assistant Examiner—Jonas N. Strickland
(74) Attorney, Agent, or Firm—Ratner & Prestia; Ira D. Blecker, Esq.

(57) ABSTRACT

A method for serializing ceramic substrates in which a laser is used to remove unfired paste material from an unfired ceramic substrate. The paste material is removed by exposing the unwanted paste material to laser radiation in a programmed sequence of x and y coordinate moves. The laser radiation removes the unwanted paste material, leaving the identifying characters intact. The identifying characters can be used for part identification and traceability.

18 Claims, 4 Drawing Sheets

PATTERN FORMATION BY REMOVAL OF PASTE MATERIAL

TECHNICAL FIELD

The present invention relates to a method for forming a pattern on ceramic parts. In particular, the invention relates to a method in which radiation is used to form identifying characters by removing unwanted paste material from an unfired ceramic substrate.

BACKGROUND OF THE INVENTION

Because of their excellent mechanical, thermal, and dielectric properties, ceramic materials are widely used as substrates for the production of integrated circuits. A pattern of conductive paste material, corresponding to the desired pattern of conductive pathways, is placed on the surface of a ceramic substrate or module in its green, or unfired, state. The resulting composite is fired to produce conductive pathways on the surface of a sintered ceramic substrate, known as a ceramic module, having high hardness and high mechanical strength. Various electronic devices are added to the module to form an integrated circuit on the surface of the ceramic substrate.

For tracking and quality control reasons, it is necessary to be able to identify and follow an individual ceramic module as it moves through the production process. This requires that each part be "serialized," that is, each ceramic module must be marked with an identifying characteristic, such as a unique sequence of alphanumeric characters.

The current method of part identification is difficult to use and produces characters that vary in size and shape. A sheet of unfired ceramic, known as a green sheet, is moved on a programmed x-y stage under a pressurized pen assembly mounted on a fixed z-axis. As the x-y table is moved, paste material is forced under pressure through a $1 \times 10^{-2}$ cm (0.004 inch) carbide tip on the pen to write the identifying characters on the green sheet. Because the flow of paste material is hard to control, the identifying characters vary in size and shape and are difficult to read. Thus, a need exists for a method for the serizalation of ceramic substrates that produces uniform identifying characters that are easy to read and which is compatible with the process used for the manufacture of ceramic modules.

SUMMARY OF THE INVENTION

To meet this and other needs, and in view of its purposes, the present invention provides a method comprising:

a) positioning a pad of unfired paste material on an unfired ceramic substrate;

b) removing a portion of the pad of unfired paste material by exposing unwanted regions of the pad of unfired paste material with a beam of radiation, whereby a pattern of unfired paste material is formed; and c) applying sufficient energy to the unfired ceramic substrate and pattern of unfired paste material to produce a sintered ceramic substrate comprising a pattern of sintered paste material.

In a preferred embodiment of the invention the paste material is conductive paste material. In another preferred embodiment, the pattern of unfired paste material forms identifying characters. Identifying characters formed by the method of the invention have greater clarity and uniformity than characters formed by previous methods. The method is compatible with the process used for the manufacture of ceramic modules.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figs.

DESCRIPTION OF THE INVENTION

The present invention is a method for forming patterns on ceramic substrates in which radiation is used to remove unfired paste material from an unfired ceramic substrate. The paste material is removed by exposing the unwanted paste material to a beam of radiation in a programmed sequence of x and y coordinate moves. The radiation removes the unwanted paste material, leaving the desired pattern intact. The pattern may be identifying characters, which can be used for part identification and traceability.

The method is typically performed on a completed substrate, not on a single layer. That is, the desired pattern is not formed until the single layers of unfired ceramic have been laminated and pressed into a single module or substrate.

A pad of paste material is positioned on the green ceramic substrate to be serialized. Green ceramic substrates suitable for use in the formation of ceramic substrates for integrated circuits are well known to those skilled in the art.

Typically, the pad of paste material serves no other purpose than to form the identifying characters. Although no electrical connections are made to the identifying characters, the same thick film conductor paste material used to form the conductive pattern is preferred for formation of the identifying characters. The identifying characters must survive the extreme temperatures of the hydrogen furnace when the green ceramic is sintered. Because the conductive paste material is the same material that is used in the conductive pattern, it does not introduce any contamination problems.

Figure 1:
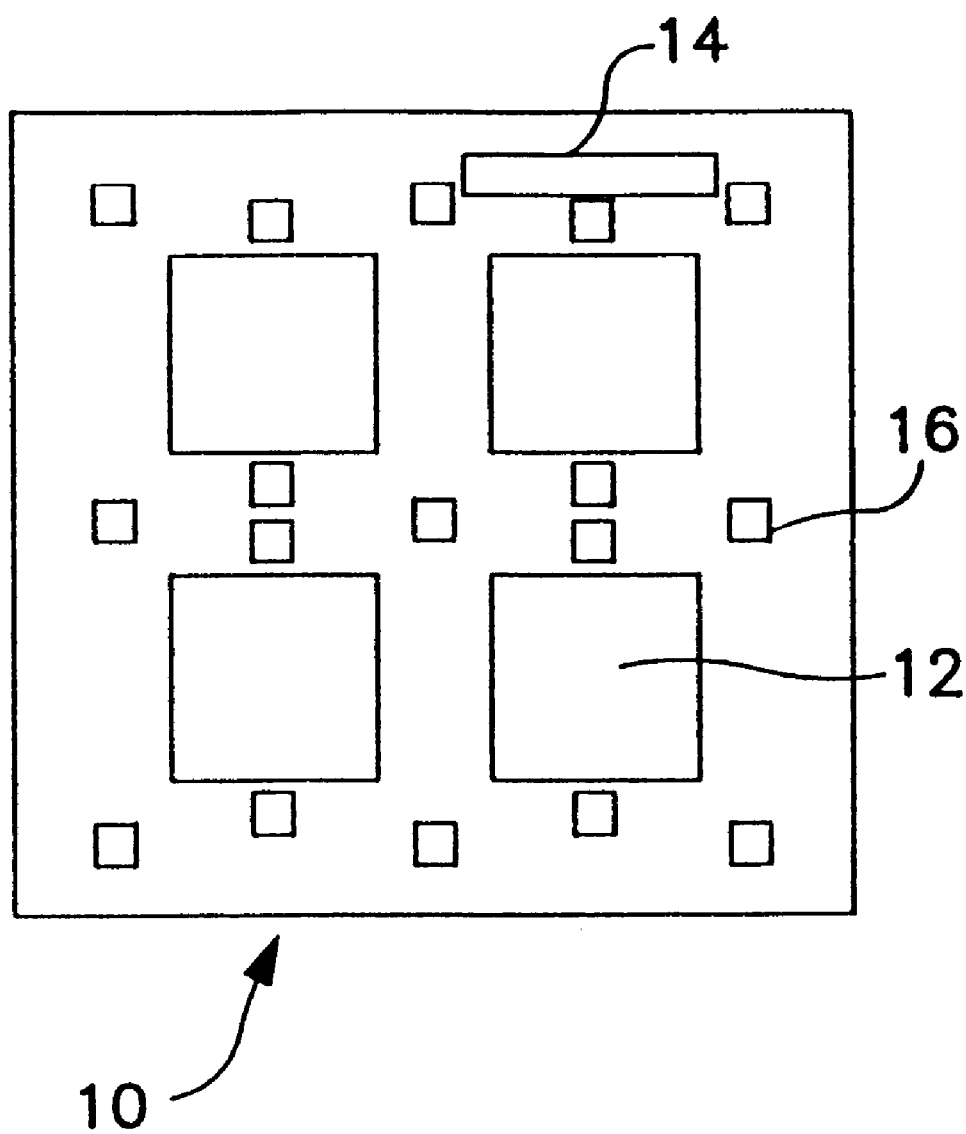
FIG. 1 shows a pad of paste material on an unfired ceramic substrate.

Referring to the Figures, FIG. 1 shows substrate 10, which is an unfired ceramic module or laminate comprising chip sites 12 and capacitor sites 16, on which has been positioned a pad of paste material 14. Any convenient method may be used to position the pad of paste material 14 on the substrate 10. When conductive paste material is used to form the identifying characters, however, positioning the pad of conductive paste material 14 on the substrate 10 does not require an additional step. A small rectangular pad can be incorporated into the design of the mask used to screen the conductive pattern of paste material 14 onto the ceramic substrate 10. This permits the conductive pattern and the pad of paste material 14 to be screened onto the green sheet in the same operation.

Thick film conductor paste materials are well known to those skilled in the art. Typically, the paste material is made up of a ceramic base, metal particles, and an organic binder. The paste material is dried to remove an solvents. The metal is typically molybdenum, copper, tungsten, or titanium. Thick film conductor paste materials are commercially available from, for example, E.I. DuPont De Nemours & Co. of Wilmington, Del.

The pad of paste material may be any convenient shape, such as a square or rectangle, and must be of sufficient size that the desired pattern can be formed from it. To minimize the amount of paste material used and the amount of time and energy necessary to remove the unwanted paste material, the pad should be no larger than is required to produce the desired pattern. When identifying characters are desired, the size will depend on the number and size of the characters to be produced. A convenient size for the production of identifying characters is a rectangle about 1.40 cm (0.550 in) by about 0.25 cm (0.10 in). The pad should be of sufficient thickness that readily readable identifying characters are formed. Typically, the pad has a thickness of 40 to 80 microns.

The identifying characters are formed by moving a beam of radiation along a predetermined path relative to the pad of unfired paste material 14. A portion of the unfired paste material is removed by the radiation. A pattern of unfired paste material, which forms the desired pattern, remains. The beam of radiation does not fire or sinter the remaining paste material; an essentially unfired pattern of paste material remains on the substrate 10 after exposure.

Any convenient source of radiation of sufficient energy density can be used to remove the unfired paste material. Coherent radiation is preferred. Typical sources of coherent radiation include, for example, Nd-YAG lasers as well as eximer lasers, such as the XeCl eximer laser. Nd-YAG lasers include, for example, the Electro Scientific Instruments (ESI) Model 44 Q-switched YAG laser and the Quantronix 603 LaserScribe.

The energy density and scan rate are determined by the thickness of the paste material to be removed and the size of the characters to be formed. For a paste thickness of 40 to 80 microns, the laser is operated at about 2 watts of average power in Q-switched mode at 4 kilohertz. Overexposure should be avoided because over-exposure can etch into the ceramic substrate 10 beneath the pad of paste material 14.

The beam of radiation is moved relative to the pad of paste material 14 to form the desired pattern by methods well known to those skilled in the art. The beam of radiation may be swept by means of mirrors that pivot to sweep the beam, such as is described in Merlin, U.S. Pat. No. 5,442,574. The substrate may be placed on an x-y table and moved relative to the beam of radiation. Or a combination of methods may be used. The path of the beam of radiation can be determined by programming a computer to control the movement of the beam and the x-y table. The beam exposes a portion of the pad of paste material, and the x-y table is moved to allow the beam to expose an unexposed portion. This process is repeated until the entire pad of paste material has been exposed to remove the unwanted paste material, leaving the desired pattern of unfired paste material.

To control the movement of the beam, a computer-controlled beam positioner is located at one corner of the pad area. The beam is commanded to scan the length of the pad as the computer monitors its position and selectively turns the beam of radiation on and off to remove selected regions of paste material along the scan line. Then the positioner returns to the start position and steps down one beam diameter and makes a second scan, again selectively removing paste material. Scanning continues until the entire pad of paste material has been scanned and all the unwanted paste material has been removed to form the desired pattern of unfired paste material.

Figure 2:
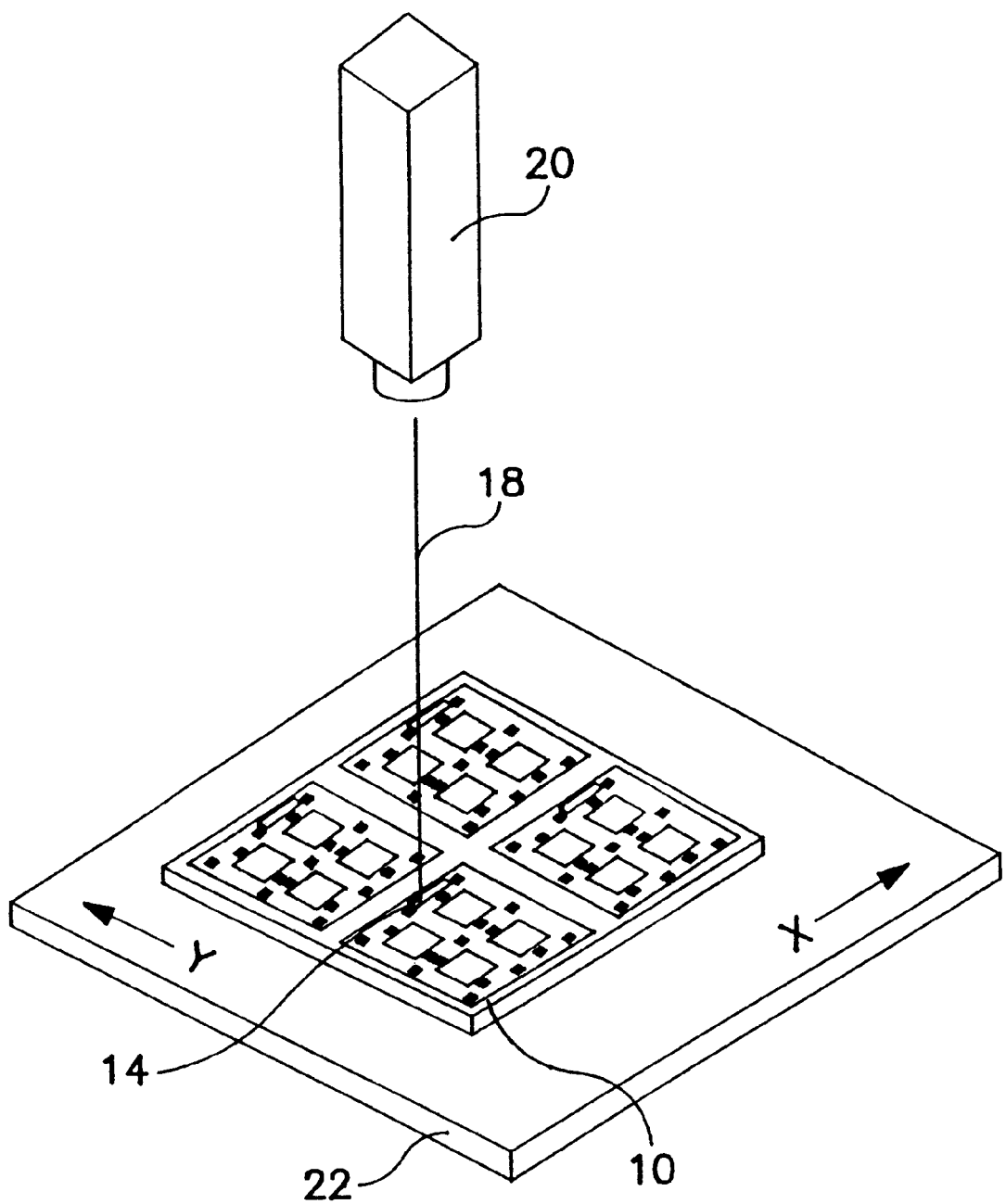
FIG. 2 shows a method for pattern formation according to the present invention.

One method of exposure is shown in FIG. 2, in which pad of paste material 14 is exposed by a beam of radiation 18 generated by a laser 20. In FIG. 2, substrate 10 is shown 4-up (i.e, four separate substrates will be formed from a single laminate). Pad of paste material 14 is positioned on substrate 10, the unfired ceramic module. Substrate 10 is placed on x-y table 22. An alphanumeric character set is programmed such that the beam of radiation 18 is scanned and turned on and off at the proper time to remove unwanted paste material. The desired pattern is formed as the beam 18 is scanned and the x-y table 22 moved in a step-and-repeat fashion. The x-y table 22 is then moved and each of the three additional pads of paste material 14 is exposed in turn by the same method.

Figure 3:
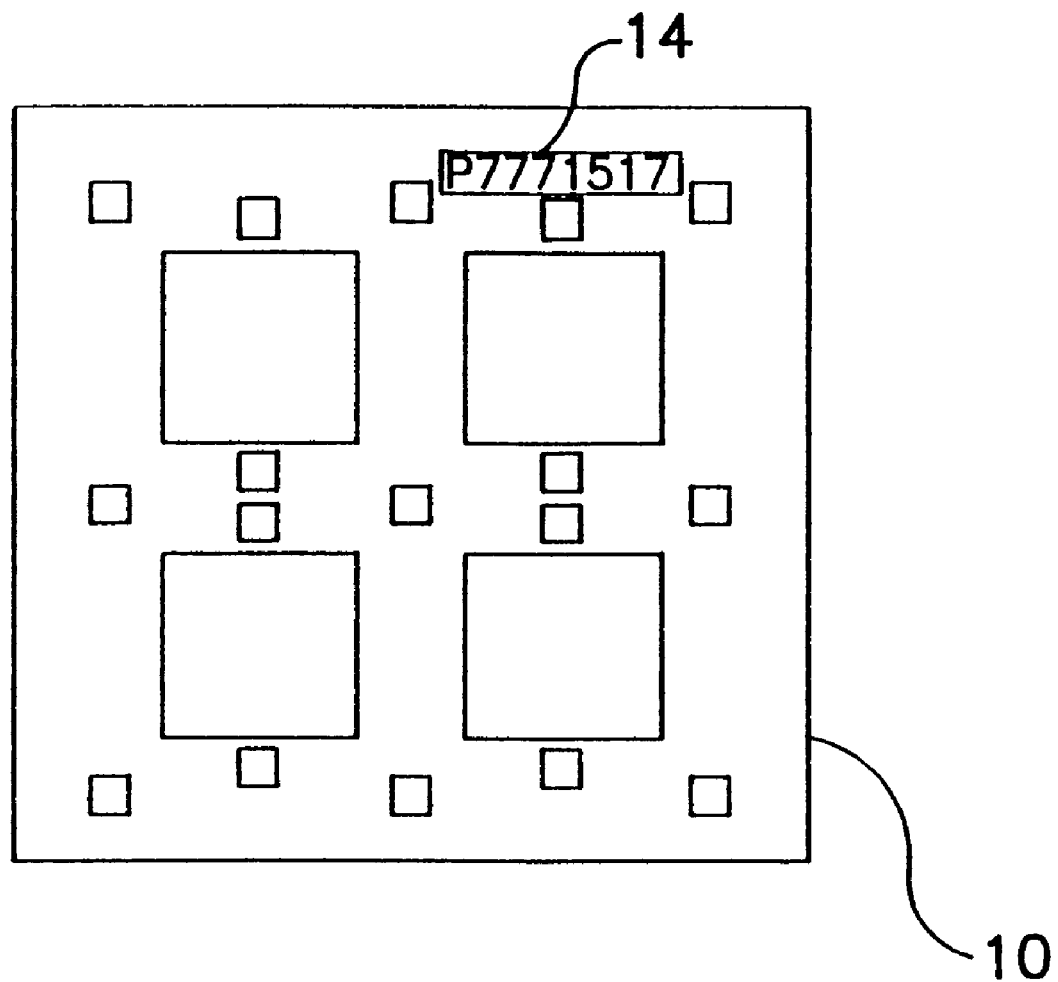
FIG. 3 shows an unfired ceramic substrate after exposure to form a pattern.
Figure 4:
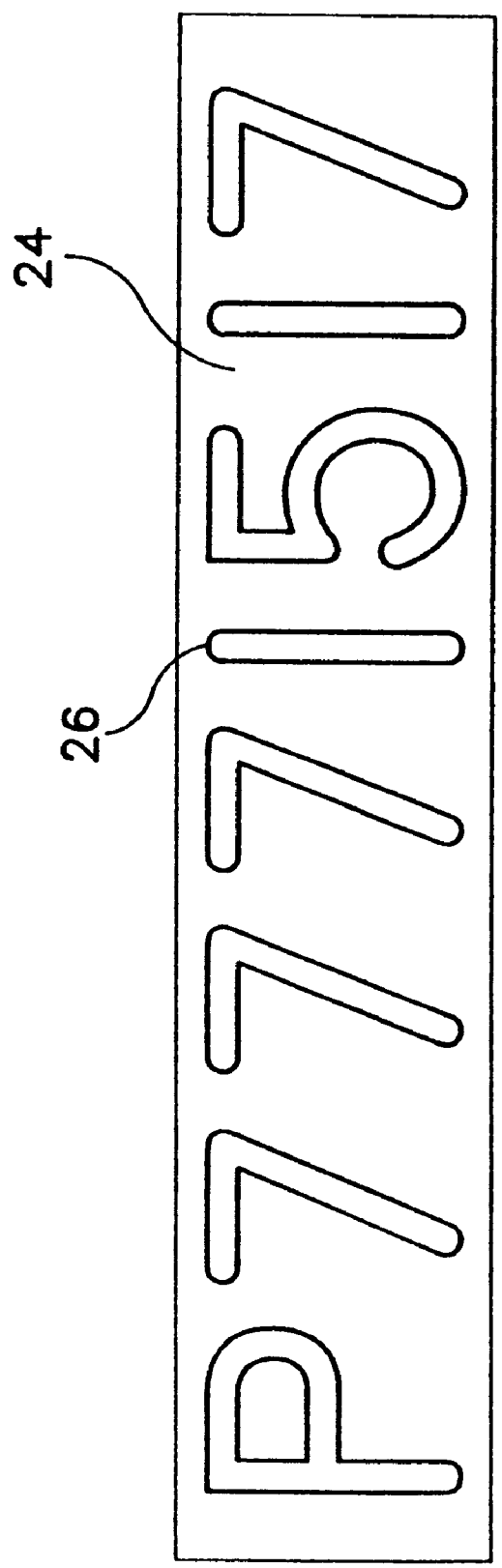
FIG. 4 shows a pattern of identifying characters formed by the method of the present invention.

FIG. 3 shows a substrate 10 after exposure to form identifying characters in pad of paste material 14. FIG. 4 shows the pattern formed in the pad of paste material 14 consisting of exposed regions 24, in which the paste has been removed, and unexposed regions 26, in which the unfired paste material remains to form the identifying characters. The identifying characters can be any shape or form, or combination of shapes and forms, that will identify the substrate 10 and the integrated circuit formed thereon. In a preferred mode, a sequence of alphanumeric characters is produced on the substrate 10.

Although the present invention has been described with respect to the formation of unique identifying characters, it should be understood that it is not limited by that description. Other patterns, shapes, or forms, such as, for example, trademarks or conductive patterns for the interconnection of electronic devices on the surface of the ceramic module, can be formed on the substrate 10 by the method of the invention.

Following formation of the desired pattern, the substrate 10 is then fired in, for example, a hydrogen furnace, to produce a sintered ceramic substrate, typically known as a ceramic module, and processed to form an integrated circuit by methods well known to those skilled in the art. The advantageous properties of the present invention can be observed by reference to the following example which illustrates, but does not limit, the invention.

EXAMPLE

A 75-micron thick film of IBM BNF molybdenum conductive paste material was screened onto an unfired em substrate of ceramic material through a mesh metal mask. The substrate was made up of 21 layers of IBM 9211 white ceramic sheet material laminated and pressed into a single module or substrate. The mask is designed to contain a small, about 1.40 cm (about 0.550 inch) by about 0.25 cm (about 0.10 inch), rectangular pad in the layout so that a pad of paste material was screened onto the green sheet when the paste material was screened onto the green sheet.

The unfired ceramic substrate was placed on a computer controlled x-y table and the pad of paste material exposed with a computer controlled Electro Scientific (ESI) Model 44 Q-switched YAG laser emitting in the infrared at a wavelength of 1064 nm (1.064 microns). The laser operated at about 2 watts of average power in Q-switched mode at 4 kilohertz. Exposure was carried out at room temperature (about 22° C.) in air at about 35% relative humidity in a non-cleanroom environment. An exhaust was placed over the exposure area to eliminate any material removed from the substrate during exposure.

An alphanumeric character set was programmed such that the beam of radiation was scanned and turned on and off at the proper time to remove unwanted paste material. A portion of the pad of paste material was exposed by the laser. Then the x-y table was moved to permit an unexposed portion of the pad of paste material to be exposed by the laser. This step-and-repeat process was repeated until the entire pad of paste material had been exposed.

Exposure removed unwanted paste material, leaving behind a pattern of unfired paste material in the form of eight alphanumeric characters. Each character was about 0.165 cm (about 0.065 inches) high by about 0.127 cm (about 0.050 inches) wide. The characters were uniform and much easier to read than those produced by a pressurized pen. The substrate can be fired in a hydrogen furnace by techniques well known to those skilled in the art to produce a ceramic module comprising the identifying characters.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method comprising:
   a) positioning a pad of unfired paste material on an unfired ceramic substrate;
   b) removing a portion of the pad of unfired paste material by exposing unwanted regions of the pad of unfired paste material with a beam of radiation, whereby a pattern of unfired paste material is formed; and
   c) applying sufficient energy to the unfired ceramic substrate and pattern of unfired paste material to produce a sintered ceramic substrate comprising a pattern of sintered paste material.

2. The method of claim 1 in which the pattern comprises identifying characters.

3. The method of claim 1 in which the unfired paste material is a conductive paste material.

4. The method of claim 3 in which the pattern comprises identifying characters.

5. The method of claim 1 in which the radiation is coherent radiation.

6. The method of claim 5 in which the pattern comprises identifying characters.

7. The method of claim 6 in which the unfired paste material is a conductive paste material.

8. A The method of claim 7 in which the unfired conductive paste material is screened onto the unfired ceramic substrate.

9. The method of claim 8 in which the unwanted regions of the pad of unfired paste material are removed by moving the beam of coherent radiation along a predetermined path relative to the pad of unfired paste material.

10. The method of claim 5 in which the unfired paste material is a conductive paste material.

11. The method of claim 10 in which the unfired conductive paste material is screened onto the unfired ceramic substrate.

12. The method of claim 11 in which the unwanted regions of the pad of unfired paste material are removed by moving the beam of coherent radiation along a predetermined path relative to the pad of unfired paste material.

13. The method of claim 12 in which the coherent radiation is 1064-nanometer radiation produced by a Nd-YAG laser.

14. The method of claim 1 in which the unfired paste material comprises a ceramic base, metal particles, and an organic binder.

15. The method of claim 14 in which the metal particles are particles of molybdenum, copper, tungsten, or titanium.

16. The method of claim 15 in which the radiation comprises coherent radiation.

17. The method of claim 16 in which the pattern comprises identifying characters.

18. The method of claim 17 in which the coherent radiation is 1064-nanometer radiation produced by a Nd-YAG laser.

* * * * *